(12) United States Patent
Inui et al.

(10) Patent No.: US 8,813,353 B2
(45) Date of Patent: Aug. 26, 2014

(54) METHOD OF MANUFACTURING A DIELECTRIC STRUCTURE

(75) Inventors: Yasuhiko Inui, Kani (JP); Takamichi Ogawa, Komaki (JP); Seiji Ichiyanagi, Niwa-gun (JP); Jun Otsuka, Konan (JP); Manabu Sato, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 1132 days.

(21) Appl. No.: 12/785,037

(22) Filed: May 21, 2010

(65) Prior Publication Data
US 2010/0242271 A1    Sep. 30, 2010

Related U.S. Application Data

(62) Division of application No. 11/634,170, filed on Dec. 6, 2006, now Pat. No. 7,750,248.

(30) Foreign Application Priority Data

Dec. 7, 2005   (JP) .................................. 2005-353791
Jan. 23, 2006  (JP) .................................. 2006-014353
Oct. 18, 2006  (JP) .................................. 2006-283292

(51) Int. Cl.
| | |
|---|---|
| H05K 3/20 | (2006.01) |
| H01L 23/498 | (2006.01) |
| H05K 1/16 | (2006.01) |
| H01L 23/50 | (2006.01) |
| H01L 21/48 | (2006.01) |
| H05K 1/09 | (2006.01) |
| H05K 3/46 | (2006.01) |

(52) U.S. Cl.
CPC ................ *H05K 1/162* (2013.01); *H05K 1/092* (2013.01); *H01L 23/49822* (2013.01); *H05K 3/4644* (2013.01); *H05K 2201/09309* (2013.01); *H05K 2201/09736* (2013.01); *H05K 2201/09509* (2013.01); *H05K 2201/0355* (2013.01); *H01L 2924/09701* (2013.01); *H05K 2201/0175* (2013.01); *H05K 2201/0352* (2013.01); *H01L 23/50* (2013.01); *H05K 2201/09718* (2013.01); *H01L 21/4857* (2013.01); *H01L 2924/0002* (2013.01)

USPC .................. 29/831; 29/423; 29/829; 29/830; 29/846; 29/852; 407/53; 407/54; 174/260; 174/261; 174/262

(58) Field of Classification Search
USPC ........ 29/423, 830, 831, 846, 852; 407/53, 54; 428/192, 209; 174/260–262
See application file for complete search history.

(56) References Cited

U.S. PATENT DOCUMENTS 6,323,439 B1 * 11/2001 Kambe et al. ................. 174/262
6,630,743 B2 * 10/2003 Magnuson et al. ........... 257/774

(Continued)

FOREIGN PATENT DOCUMENTS

| EP | 1408520 A2 | 4/2004 |
| JP | 2000-353875 A | 12/2000 |
| JP | 2001-319840 A | 11/2001 |
| JP | 2004-134806 A | 4/2004 |

(Continued)

*Primary Examiner* — Paul D Kim
(74) *Attorney, Agent, or Firm* — Sughrue Mion, PLLC

(57) ABSTRACT

A dielectric structure including a metal foil, a dielectric layer and a conductor layer provided in this order, wherein the metal foil has a thickness of from 10 to 40 μm, the dielectric layer has a thickness of from 0.3 to 5 μm, and the conductor layer has a thickness of from 0.3 to 10 μm. The dielectric structure has plural vias which are separated from each other, and which penetrate through both of the dielectric layer and the conductor layer. The vias of the dielectric layer have different diameters which are in a range of from 100 to 300 μm, a diameter of each of the vias of the conductor layer is larger than a diameter of a corresponding via of the dielectric layer by 5 to 50 μm, and a minimum via pitch is from 100 to 350 μm.

15 Claims, 12 Drawing Sheets

(56) References Cited

U.S. PATENT DOCUMENTS

| | | |
|---|---|---|
| 6,631,558 B2 * | 10/2003 | Burgess .......................... 29/852 |
| 6,638,858 B2 * | 10/2003 | Cheng ........................... 438/678 |
| 7,161,793 B2 * | 1/2007 | Kurihara et al. ........... 361/306.3 |
| 7,627,947 B2 * | 12/2009 | Davis et al. ..................... 29/852 |
| 2004/0231885 A1 | 11/2004 | Borland et al. |

FOREIGN PATENT DOCUMENTS

| | | |
|---|---|---|
| JP | 2004-165477 A | 6/2004 |
| JP | 2004-165478 A | 6/2004 |
| JP | 2005-142352 A | 6/2005 |
| JP | 2005-244164 A | 9/2005 |

* cited by examiner 6-1

6-2

6-3

9-1

9-2

9-3

9-4

METHOD OF MANUFACTURING A DIELECTRIC STRUCTURE

CROSS-REFERENCE TO RELATED APPLICATIONS

This is a Divisional Application of prior application Ser. No. 11/634,170 filed Dec. 6, 2006, now U.S. Pat. No. 7,750,248, which claims priority from Japanese Patent Application Nos. 2005-353791, filed Dec. 7, 2005; 2006-014353, filed Jan. 23, 2006 and 2006-283292, filed Oct. 18, 2006, the entire disclosures of which are hereby incorporated by reference in their entirety.

BACKGROUND OF THE INVENTION

1. Field of the Invention

The present invention relates to a dielectric lamination structure (dielectric stacked structure) and a wiring board having a dielectric lamination structure. More specifically, the invention relates to a capacitor incorporated in a wiring board as well as to such a wiring board.

2. Description of the Related Art

In recent years, with the requirements of increase in functionality and reduction in size and weight on electronic equipment, the integration density of electronic components such as ICs (integrated circuits) and LSIs (large scale integration) have increased rapidly and those electronic components have come to operate at increasingly high speeds. With this trend, wiring boards which are mounted with electronic components are required to be even higher in wiring density and have even more terminals than before.

Incidentally, in an IC which operates at high speed, when many devices are switched simultaneously at high speed, an inductance component between a power source and the IC obstructs high-speed operation of the IC because all of necessary high-frequency currents are supplied from the power source. As one countermeasure against this problem, that is, to supply the IC with charge necessary for its operation, a capacitor is provided in a wiring board, whereby a local power source is provided in the vicinity of the IC. Charge is stored in the capacitor in a DC sense and the capacitor stably supplies the IC with charge necessary for its operation.

A technique that a capacitor is incorporated in a wiring board (i.e., "in the vicinity of" an IC) has been proposed. In this technique, the capacitor is disposed inside an insulating resin layer of build-up layers which are formed on a board core because disposing the capacitor closer to the IC can make the wiring resistance and the inductance component lower.

The insulating resin layer of the build-up layers is thin, it would be natural that the thickness of the capacitor which is disposed inside the insulating resin layer be made small. However, if the capacitor were unduly thin, it would become insufficient in rigidity to cause a warp, cracks, or the like. For example, this raises a problem that the process of incorporating the capacitor into the wiring board becomes difficult to execute. For example, JP-A-2004-134806 (corresponding to EP 1 408 520 A2) discloses a structure which is produced by forming a first thick-film dielectric having through-holes on a metal foil, then forming a first electrode having through-holes on the dielectric by screen printing, and finally firing the metal foil, the first thick-film dielectric, and the first electrode at the same time. This structure can prevent development of cracks and separation of the dielectric and the first electrode due to the difference in thermal expansion coefficient when the dielectric and the first electrode are fired at the same time.

3. Problems to be Solved by the Invention

However, the technique of JP-A-2004-134806 (corresponding to EP 1 408 520 A2), which uses the thick-film dielectric, cannot prevent development of cracks and separation which are caused by a warp or the like of the capacitor itself which occurs due to, for example, the difference between the thermal expansion coefficients of the capacitor and the insulating resin layer of the build-up layers in the case where a thin dielectric is formed so that the capacitor is incorporated in a wiring board. Furthermore, the use of the thick-film dielectric is contrary to the requirement of reduction in size and weight. If the capacitor has an entirely flat structure, peeling may occur at the boundary between the insulating resin material and the capacitor when the capacitor is incorporated into (mounted on) the insulating resin layer of the build-up layers. In addition, there may occur an event that air bubbles enter the boundary between the capacitor and the insulating resin material at the time of mounting.

Where the first electrode is formed on the dielectric by screen printing, there may occur an event that a printing mask for formation of the first electrode is deviated from the dielectric and, resultingly, conductor paste to form the first electrode goes into the through-holes of the dielectric to render the metal foil and the first electrode electrically continuous with each other. This raises a problem that such an event lowers the production yield and makes it impossible to secure sufficient reliability of the capacitor.

SUMMARY OF THE INVENTION

The present invention has been made in view of the above circumstances, and an object of the invention is therefore to provide a highly reliable dielectric lamination structure which is not prone to warp even if, in particular, a thin capacitor is formed and makes it easier to execute a process of incorporating a capacitor into an insulating resin layer of build-up layers, a manufacturing method of a dielectric lamination structure capable of increasing the production yield and manufacturing a highly reliable dielectric lamination structure, and a wiring board having such a dielectric lamination structure.

To solve the above problems, the invention provides a dielectric lamination structure in which a dielectric layer and a conductor layer are provided in this order on at least one surface of a metal foil, characterized in:

that the thickness of the metal foil is 10 to 40 µm, the thickness of the dielectric layer is 0.3 to 5 µm, and the thickness of the conductor layer is 0.3 to 10 µm;

that plural vias which are separated from each other penetrate through both of the dielectric layer and the conductor layer in a thickness direction; and that the vias of the dielectric layer have different diameters which are in a range of 100 to 300 µm, the diameter of each of the vias of the conductor layer is larger than the diameter of a corresponding via of the dielectric layer by 5 to 50 µm, and a minimum via pitch is in a range of 100 to 350 µm.

Usually, when a dielectric lamination structure is mounted on (incorporated in) an insulating resin layer of build-up layers, it is put on the insulating resin layer while being pressed against the latter to some extent and the dielectric lamination structure is warped by the pressing. In particular, cracks may develop in the dielectric layer. On the other hand, in the invention, since the dielectric lamination structure is formed by laminating the dielectric layer and the conductor layer on the metal foil which is 10 to 40 µm in thickness, the metal foil is relatively high in rigidity. As a result, the dielectric lamination structure is made flat and given sufficient flexibility. When the dielectric lamination structure is mounted on an insulating resin layer of build-up layers, development of cracks or the like due to pressing can be prevented. Furthermore, since the dielectric layer is as thin as 0.3 to 5 μm and the conductor layer is as thin as 0.3 to 10 μm, the dielectric lamination structure can easily be incorporated in an insulating resin layer of build-up layers and a sufficient capacitance can be secured.

The plural vias which are separated from each other penetrates through both of the dielectric layer and the conductor layer. Therefore, when the dielectric lamination structure is mounted on an insulating resin layer of build-up layers, the contact area is larger, by the sum of the areas of the inside surfaces of the vias, than, for example, in a case that the surface that is in contact with an insulating resin layer of build-up layers or the like is completely flat. The adhesion is increased accordingly and an event that the dielectric lamination structure is peeled off due to warping or the like of the wiring board can be avoided. It is preferable that the vias of the dielectric layer have different diameters which are in a range of 100 to 300 μm. In this case, it is preferable that the diameter of each of the vias of the conductor layer be larger than the diameter of a corresponding via of the dielectric layer by 5 to 50 μm. It is also preferable that the minimum one of via pitches of the vias be in a range of 100 to 350 μm. If the diameter of the vias of the dielectric layer is not larger than or equal to 100 μm, the vias are too small to provide sufficient adhesion. If the difference between the diameter of each via of the dielectric layer and that of the corresponding via of the conductor layer does not satisfy the condition 5 to 50 μm, portions of the conductor layer may pass the dielectric layer and brought into contact with the metal foil. On the other hand, if the vias of the dielectric layer is larger than 300 μm and the diameter of each via of the conductor layer is larger than that of the corresponding via of the dielectric layer by more than 50 μm, the area of the conductor layer becomes too small to secure a sufficient capacitance. Setting the minimum via pitch in the range of 100 to 350 μm makes it possible to arrange the vias without causing short-circuiting.

The dielectric lamination structure according to the invention may be such that through-holes penetrate through the metal foil in the thickness direction so as to communicate with the respective vias, and that the diameter of each of the through-hole is smaller than the diameter of a corresponding via of the dielectric layer. In the invention, the vias and the through-holes which communicate with each other are formed in the dielectric lamination structure. Therefore, when the dielectric lamination structure is mounted on a dielectric resin layer of build-up layers, air etc. located in between are guided to above the dielectric lamination structure via the through-holes, whereby entrance of air bubbles etc. into the boundary between the dielectric lamination structure and the dielectric resin layer of the build-up layers can be suppressed. Without intervention of air bubbles etc., the adhesion between the dielectric lamination structure and the dielectric resin layer of the build-up layers is increased and peeling of the dielectric lamination structure can be prevented. Since the diameter of each combination of a through-hole and a via increases stepwise from the metal foil to the conductor layer, it becomes easier for, for example, the insulating resin layer of the build-up layers to go into the insides of the through-holes.

In the dielectric lamination structure according to the invention, the positional deviation between the center of each of the vias of the dielectric layer and the center of a corresponding via of the conductor layer may be less than or equal to 10 μm. In the invention, since the positional deviation between the center of each via of the dielectric layer and the center of a corresponding via of the conductor layer is less than or equal to 10 μm, the length $d_2$ of retreat of the side surface $4a_1$ from the side surface $3a_1$ (see FIG. 13) is made uniform among all side surfaces $4a_1$ and a sufficient distance (insulation distance) can be secured reliably between the metal foil and the conductor layer. This makes it possible to provide a highly reliable dielectric lamination structure.

In the dielectric lamination structure according to the invention, the dielectric layer and the conductor layer may be provided on both sides of the metal foil (thus, a conductor layer, a dielectric layer, the metal foil, a dielectric layer, and a conductor layer are provided in this order) so as to be arranged symmetrically with respect to the metal foil. In the invention, since the dielectric layer and the conductor layer may be provided on both surfaces of the metal foil, the influence on the metal foil of sintering contraction of the dielectric layers which occurs at the time of firing is reduced and warping or deformation of the dielectric lamination structure is suppressed. Arranging the dielectric layers symmetrically with respect to the metal foil is effective in further suppressing warping of the dielectric lamination structure which otherwise tends to occur at the time of firing.

In the dielectric lamination structure according to the invention, the metal foil may be an Ni foil. Where the metal foil is an Ni foil, the metal foil is given high rigidity and the dielectric lamination structure is made flat and sufficiently flexible, which makes it possible to prevent development of cracks or the like due to pressing which is performed when the dielectric lamination structure is mounted on an insulating resin layer of build-up layers. Examples, other than Ni, of the material of the metal foil are tungsten, copper, gold, platinum, and palladium. Among these materials, Ni is most appropriate in terms of the firing conditions, conductivity, and cost.

In the dielectric lamination structure according to the invention, the conductor layer may contain ceramic powder at 50 vol % or less. In the invention, since the conductor layer contains ceramic powder, the adhesion between the conductor layer and the dielectric layer is increased. In the dielectric lamination structure according to the invention, the ceramic powder contained in the conductor layer may have the same composition as ceramics as a material of the dielectric layer. Using, as the ceramic powder, a material having the same composition as ceramics as the material of the dielectric layer can further increase the adhesion. If the conductor layer contains the ceramic powder at more than 50 vol %, reduction in conductivity (increase in resistivity) or reduction in flexibility may occur after firing.

The dielectric layer is made of dielectric ceramics such as barium titanate, lead titanate, or strontium titanate. Alternatively, the dielectric layer may be made of low-temperature-fired ceramics such as glass ceramics obtained by adding an inorganic ceramic filler to borosilicate glass or lead borosilicate glass. As a further alternative, to attain required characteristics, the dielectric layer may be made of high-temperature-fired ceramics such as alumina, aluminum nitride, boron nitride, silicon carbide, or silicon nitride.

The dielectric lamination structure according to the invention, maybe such as to be deformed in a radius-of-curvature range of 5 to 500 mm when a prescribed jig is pressed against the dielectric lamination structure directly or indirectly from the side of the conductor layer in a state that the conductor layer is an outermost layer.

In the invention, the dielectric lamination structure having such flexural strength as to satisfy the above condition is highly flexible and hence is not prone to cracks or the like which may otherwise develop in a process of mounting the dielectric lamination structure on an insulating resin layer of build-up layers or due to warping of a wiring board. As such, the dielectric lamination structure can be made highly reliable.

A wiring board according to the invention incorporates the dielectric lamination structure having the above-described workings and advantages. The wiring board is provided with an insulating resin layer which covers the dielectric lamination structure, and an electrode layer and thickness-direction conductors which electrically connect the electrode layer and the conductor layer are formed on at least a front surface of the insulating resin layer. Therefore, the dielectric lamination structure can be integrally incorporated in the wiring board as part of a capacitor. Since the thickness-direction conductors are arranged in array form, the wiring length can be shortened in implementation and high-density implementation is thus enabled.

DESCRIPTION OF REFERENCE NUMERALS

Figure 1:
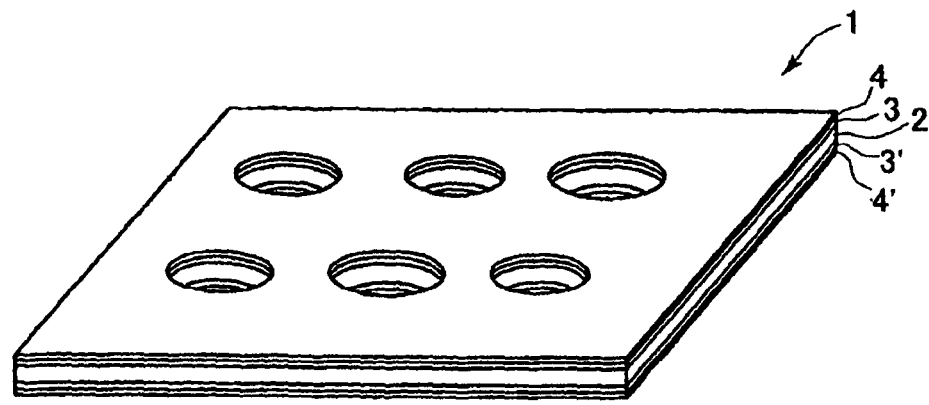
FIG. 1 is a perspective view of an exemplary dielectric lamination structure according to the present invention.

Reference numerals used to identify various structural features in the drawings include the following.
1: Dielectric lamination structure
2: Metal foil (inner electrode layer)
2a: Through-hole
3: Dielectric layer
3a: Via
4: Conductor layer (inner electrode layer)
4a: Via 5: Communication hole
6, 7: Outer electrode layer
8, 8a, 8b, 8c, 9: Via conductor (via, thickness-direction conductor)
10, 50: Capacitor
16, 17: Insulating resin layer
100: Wiring board

DETAILED DESCRIPTION OF THE INVENTION

Embodiments of the present invention will be hereinafter described with reference to the accompanying drawings.

Figure 2:
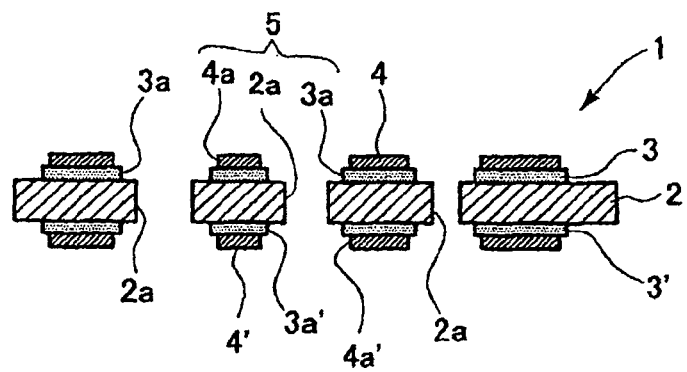
FIG. 2 is a sectional view of the exemplary dielectric lamination structure according to the invention.
Figure 3:
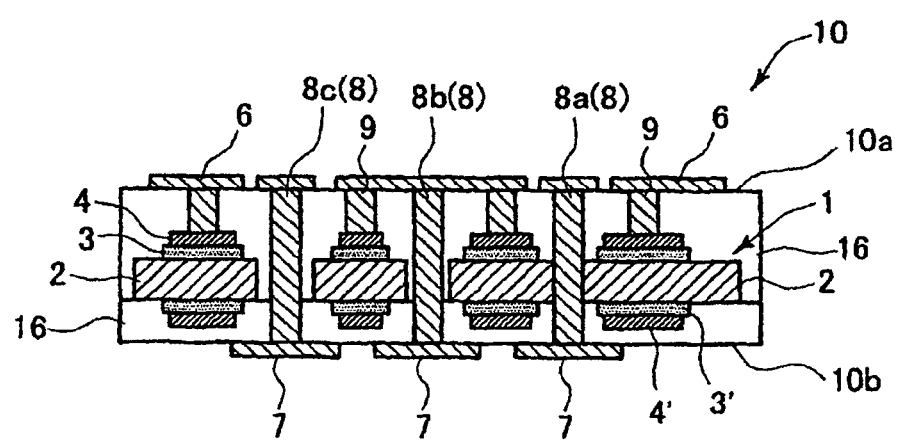
FIG. 3 is a sectional view of a capacitor according to the invention.

FIG. 1 is a perspective view of a dielectric lamination structure 1 according to the invention. FIG. 2 is a sectional view of the dielectric lamination structure 1 according to the invention. FIG. 3 is a schematic sectional view of a capacitor 10 according to the invention. In this embodiment, it is assumed that a first major surface and a second major surface of a plate-like member shown in a figure are the top surface and the bottom surface in the figure, respectively. (In the following description, the top dielectric layer will be called "first dielectric layer 3" and the bottom dielectric layer will be called "second dielectric layer 3'." The terms "first conductor layer 4" and "second conductor layer 4'" will be used in a similar manner.)

As shown in FIGS. 1 and 2, the dielectric lamination structure 1 is provided with a metal foil (inner electrode layer) 2 which is made of a metal such as nickel, first and second dielectric layers 3 and 3' which are made of, for example, high-permittivity ceramics such as barium titanate ($BaTiO_3$; hereinafter may be abbreviated as "BT"), and first and second conductor layers (inner electrode layers) 4 and 4' which are made of a metal such as nickel. The first dielectric layer 3 and the first conductor layer 4 are laminated on the front surface of the metal foil 2 in this order, and the second dielectric layer 3' and the second conductor layer 4' are laminated on the back surface of the metal foil 2 in this order. The metal foil 2 is thus electrically insulated from the first and second conductor layers 4 and 4'. The dielectric lamination structure 1 has a plate-like form which is square or rectangular in a plan view.

In the dielectric lamination structure 1, plural communication holes 5 are provided in a prescribed pattern each of which consists of a through-hole 2a formed in the metal foil 2, vias 3a and 3a' formed in the respective dielectric layers 3 and 3', and vias 4a and 4a' formed in the respective conductor layers 4 and 4', has a circular shape in a plan view, and extends in the thickness direction. The communication holes 5 are classified into several groups having different diameters. The diameter of each communication hole 5 increases stepwise in the directions from the metal foil 2 to the first and second conductor layers 4 and 4' past the first and second dielectric layers 3 and 3'. The first and second dielectric layers 3 and 3' are formed symmetrically with respect to the metal foil 2 in a sense that the communication holes 5 are included. The first and second conductor layers 4 and 4' are also formed symmetrically in the same manner. Only one of the combination of the first dielectric layer 3 and the first conductor layer 4 and the combination of the second dielectric layer 3' and the second conductor layer 4' may be formed on one surface of the metal foil 2. However, forming the first and second dielectric layers 3 and 3' and the first and second conductor layers 4 and 4' symmetrically on both of the front and back surfaces of the metal foil 2 can suppress warping which otherwise tends to occur due to the difference between the thermal expansion coefficients of the metal foil 2 and the first and second dielectric layers 3 and 3' at the time of simultaneous firing, for example.

As shown in FIG. 3, the capacitor 10 is provided with the dielectric lamination structure 1 (core member), insulating resin layers 16 which cover the dielectric lamination structure 1, a first outer electrode layer 6 formed on a first major surface 10a of the capacitor 10, a second outer electrode layer 7 formed on a second major surface 10b of the capacitor 10, via conductors 8 (8a, 8b, and 8c) which penetrate through the capacitor 10 in the thickness direction and electrically connect the first and second outer electrode layers 6 and 7, and via conductors 9 which penetrate through the insulating resin layer 16 from the first major surface 10a to the first conductor layer 4 and electrically connect the first outer electrode layer 6 and the first conductor layer 4. Although not shown in FIG. 3, the capacitor 10 is also formed with a dielectric lamination structure (dummy capacitor) in which the first conductor layer 4 is not electrically continuous with the via conductors 9. With the above structure, the adhesion which is necessary when the capacitor 10 is mounted on a wiring board 100 (see FIG. 4; described later) is increased and peeling of the capacitor 10 off the wiring board 100 can be prevented or suppressed.

The first and second outer electrode layers and 7 are used as a power supply electrode, a grounding electrode, or a signal transmission electrode, for example, and are electrically connected to each other via the via conductors 8.

The via conductors 8, which are inserted in the respective communication holes 5, include a via conductor(s) 8a which is electrically connected to the metal foil 2 which is one inner electrode layer and a via conductor(s) 8b which is electrically insulated from the metal foil 2 and electrically connected, via the first outer electrode layer 6, to the first conductor layer 4 which is another inner electrode layer. A signal transmission via conductor(s) 8c may further be provided which is electrically insulated from the metal foil 2 and the first and second conductors 4 and 4'. The via conductors 8a, 8b, and 8c have the same diameter. More specifically, as mentioned above the communication holes 5 are classified into several groups having different via diameters, and the diameter of the via conductors 8a, 8b, and 8c corresponds to the minimum one of the diameters of the through-holes 2a of the metal foil 2. Therefore, the via conductor(s) 8a is electrically connected to the metal foil 2 and the via conductors 8b and 8c are electrically insulated from the metal foil 2 merely by forming (inserting) the via conductors 8a, 8b, and 8c in the communication holes 5. The diameter of each communication hole 5 increases in the directions from the metal foil 2 to the first and second conductor layers 4 and 4' (in other words, the diameters of the vias 4a and 4a' are larger than the diameter of the through-hole 2a of the metal foil 2). Therefore, when the via conductor(s) 8a is formed, it can be electrically insulated from the first and second conductor layers 4 and 4'.

The plural via conductors 9 are provided for the first conductor layer 4 in array form.

Figure 4:
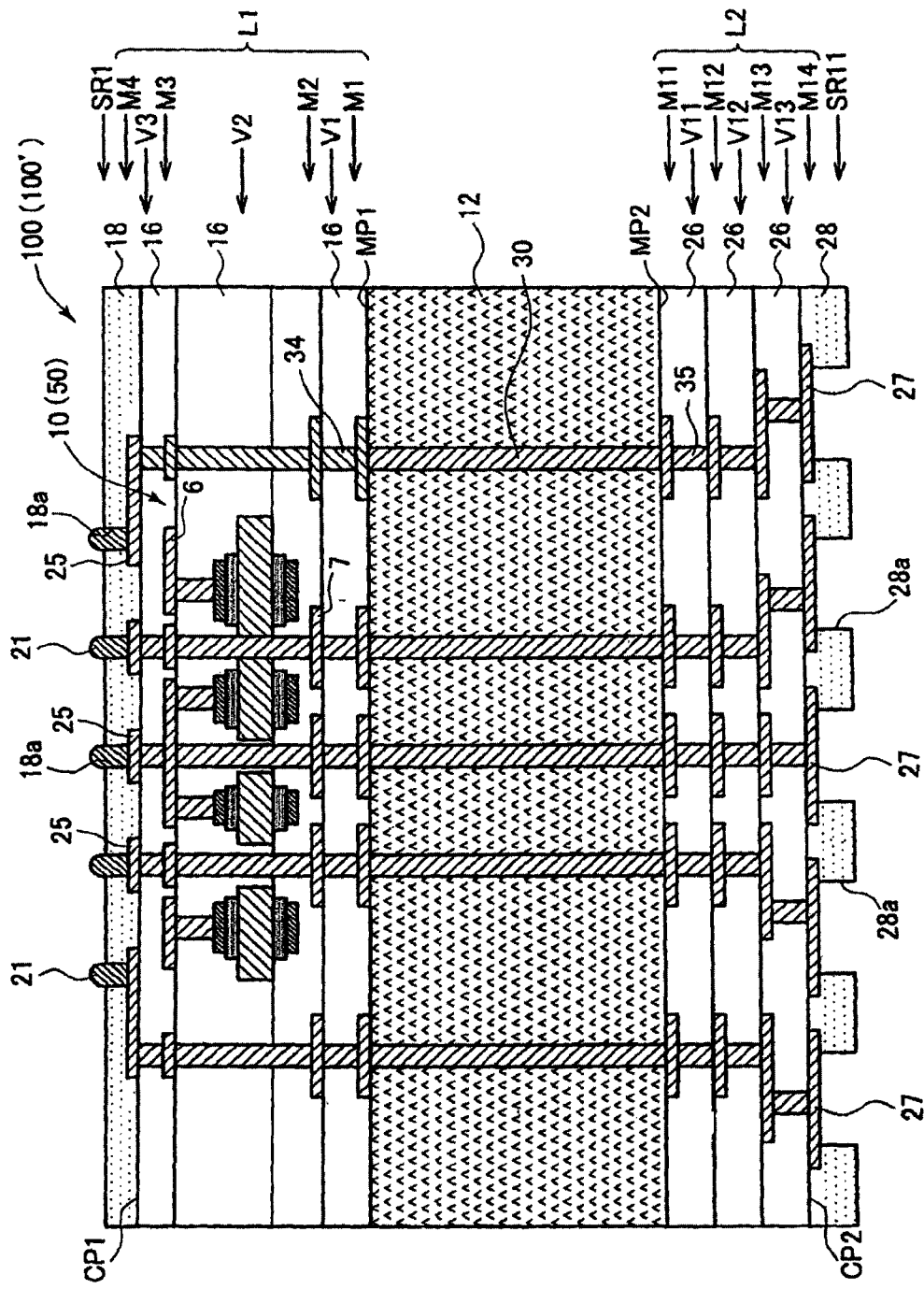
FIG. 4 is a sectional view of an exemplary wiring board according to the invention.

Next, a wiring board 100 incorporating the above-configured capacitor 10 will be described. FIG. 4 is a schematic sectional view showing the configuration of the wiring board 100. The wiring board 100 is configured in such a manner that first and second core conductor layers M1 and M11 as wiring metal layers having prescribed patterns are formed on first and second major surfaces MP1 and MP2, respectively, of a board core 12 which is a heat-resistant resin plate (e.g., bis-maleimide triazine resin plate), a fiber-reinforced resin plate (e.g., glass-fiber-reinforced epoxy resin plate), or the like. The first and second core conductor layers M1 and M11 are formed as surface conductor patterns for covering the first and second major surfaces MP1 and MP2 of the board core 12, and are used as a power supply layer or a grounding layer. On the other hand, through-holes are formed through the board core 12 with drills, for example, and through-hole conductors 30 for electrically connecting the first and second core conductor layers M1 and M11 are formed in the respective through-holes.

Plural insulating resin layers 16 (V1-V3) and 26 (V11-V13) which are made of a thermosetting resin composition, for example, are formed on the surfaces of the first and second core conductor layers M1 and M11. Furthermore, conductor layers M2-M4 and M12-M14 having metal interconnections are formed between the insulating resin layers 16 (V1-V3) and 26 (V11-V13) by Cu plating, for example. The first core conductor layer M1 and the conductor layer M2 are connected to each other by via conductors 34, and the second core conductor layer M11 and the conductor layer M12 are connected to each other by via conductors 35 (interlayer connections). Likewise, the conductor layers M2-M4 are connected to each other by via conductors 34, and the conductor layers M12-M14 are connected to each other by via conductors 35. The conductor layer M4 formed on the surface of the topmost insulating resin layer 16 (V3) has metal terminal pads 25, and the conductor layer M14 formed on the bottommost insulating resin layer 26 (V13) has metal terminal pads 27. The via conductors 34 and 35 formed through the respective insulating resin layers 16 (V3) and 26 (V13) are what is called filled vias formed by filling via holes by Cu plating, for example. The via conductors 34 and 35 may be of other types; for example, they may be what is called conformal vias having via pads which are provided on the bottom surface side so as to be electrically continuous with the via conductors 34 and 35 and via lands which are provided on the opposite side so as to project outward from the opening peripheries of the via conductors 34 and 35.

The wiring board 100 incorporates the capacitor 10 in a central portion of the insulating resin layer 16 (V2) which is formed on the board core 12. The capacitor 10 is provided within the thickness of the insulating resin layer 16 (V2), and the capacitor 10, more specifically, the first and second outer electrode layers 6 and 7 and the first and second major surfaces 10a and 10b are in close contact with the adjacent insulating resin layers 16. The conductor layers M2 and M3 may be formed so as to include the first and second outer electrode layers 6 and 7 of the capacitor 10, respectively, and the insulating resin layer 16 (V2) of the wiring board 100 may be formed so as to include the insulating resin layer 16 of the capacitor 10. In this case, the build-up layers and the capacitor 10 are integrated with each other, and hence the top surface of the capacitor 10 can easily be made flat and the build-up layers can be made stable.

On the first major surface MP1 of the board core 12, the core conductor layer M1, the conductor layers M2-M4, and the insulating resin layers 16 (V1-V3) form a first wiring lamination portion L1. On the second major surface MP2 of the board core 12, the core conductor layer M11, the conductor layers M12-M14, and the insulating resin layers 26 (V11-V13) form a second wiring lamination portion L2. Each of the first and second wiring lamination portions L1 and L2 is formed by laminating the insulating resin layers and the conductor layers alternately so that the surface of the outermost insulating resin layer 16 becomes a first or second major surface CP1 or CP2. The plural metal terminal pads 25 are formed on the first major surface CP1, and the plural metal terminal pads 27 are formed on the second major surface CP2. The metal terminal pads 25 on the side of the first wiring lamination portion L1 serve as solder lands for flip chip connection of an integrated circuit chip or the like. The metal terminal pads 27 on the side of the second wiring lamination portion L2 are used as back surface lands (PGA pads or BGA pads) for connecting the wiring board 100 itself to a mother board or the like via a pin grid array (PGA) or a ball grid array (BGA).

The metal terminal pads 25 as the solder lands are arranged in the form of lattice points (i.e., in array form) in a central region of the first major surface CP1 of the wiring board 100, and form a chip mounting portion together with solder bumps 21 formed thereon. The metal terminal pads 27 as the back surface lands are also arranged in the form of lattice points (i.e., in array form) on the second major surface CP2. Solder resist layers 18 and 28 (SR1 and SR11) made of a photosensitive or thermosetting resin composition are formed on the outermost conductor layers M4 and M14, respectively. To expose parts of the metal terminal pads 25 as the solder lands and parts of the metal terminal pads 27 as the back surface lands, exposing holes 18a and 28a are formed through the solder resist layers 18 and 28 so as to be in one-to-one correspondence with the metal terminal pads 25 and 27. The solder bumps 21 in the solder resist layer 18 which is formed on the side of the first wiring lamination portion L1 may be made of solder containing substantially no Pb such as Sn—Ag, Sn—Cu, Sn—Ag—Cu, or Sn—Sb. On the other hand, the metal terminal pads 27 which are formed on the side of the second wiring lamination portion L2 are formed so as to be partially exposed in the exposing holes 28a of the solder resist layer 28. In the wiring board 100, signal transmission paths are formed so as to extend from the metal terminal pads 25 which are formed on the side of the first major surface MP1 of the board core 12 (i.e., on the side of the first wiring lamination portion L1) to the metal terminal pads 27 which are formed on the side of the second major surface MP2 (second wiring lamination portion L2).

The thus-described wiring board 100 can be manufactured by forming the first and second wiring lamination portions L1 and L2 on the first and second major surfaces MP1 and MP2 of the board core 12, respectively, by a known build-up method or the like. Before executing a build-up process to form the first and second wiring lamination portions L1 and L2, through-holes are formed through the board core 12 and the through-hole conductors 30 are formed in the through-holes by Cu plating or the like. A manufacturing method of the wiring board 100 will be described below together with a manufacturing method of the capacitor 10.

Figure 5:
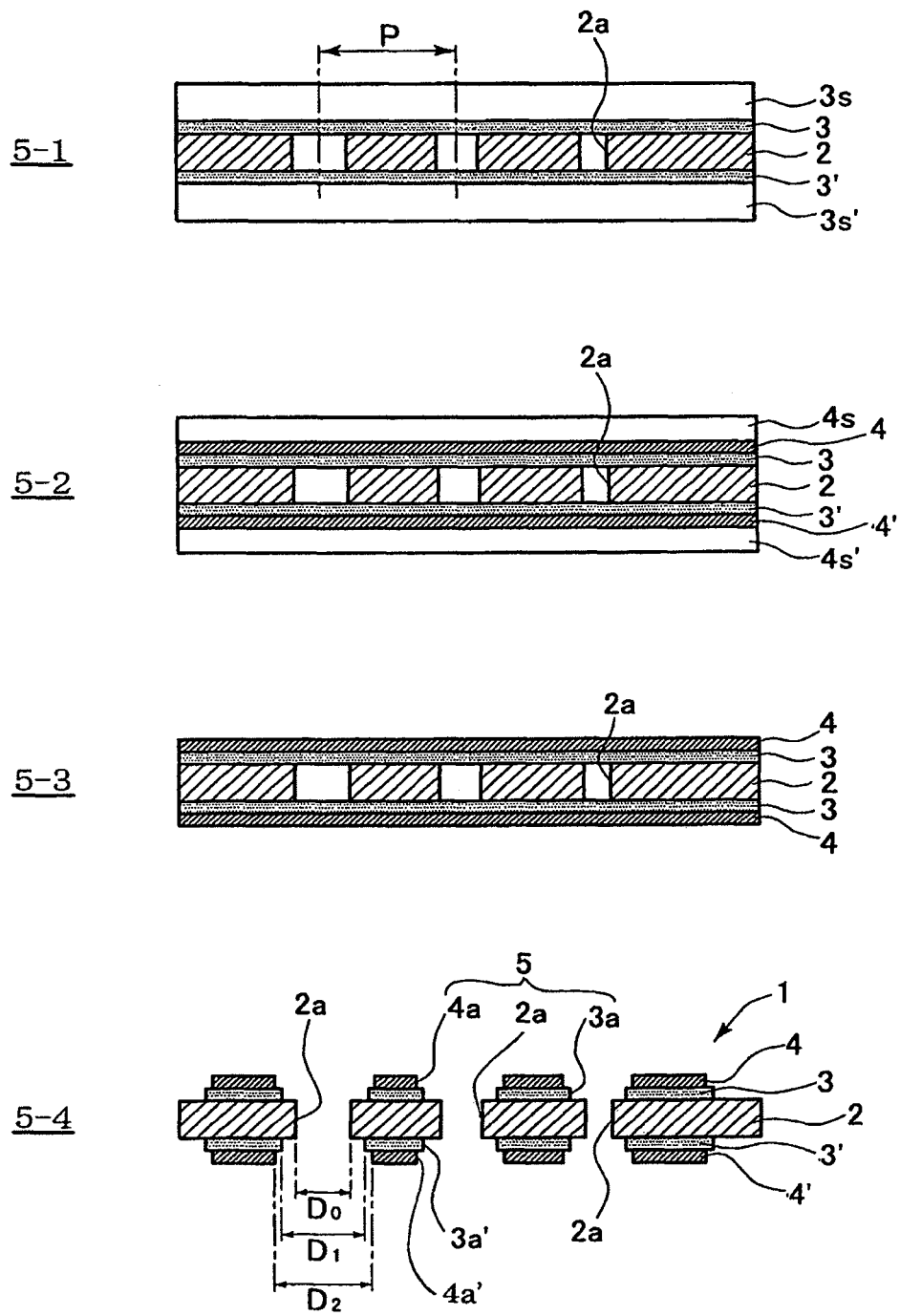
FIG. 5 is explanatory diagrams showing manufacturing steps of the dielectric lamination structure according to the invention.
Figure 6:
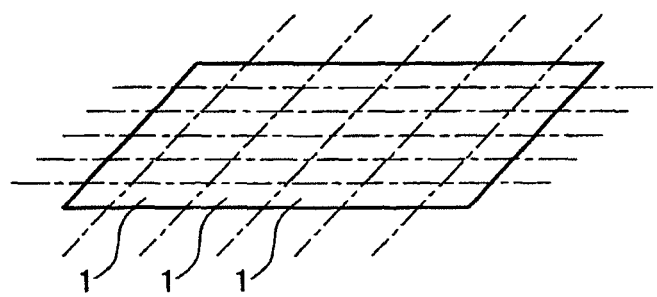
FIG. 6 is explanatory diagrams showing manufacturing steps of the capacitor following the steps of FIG. 5.
Figure 6:
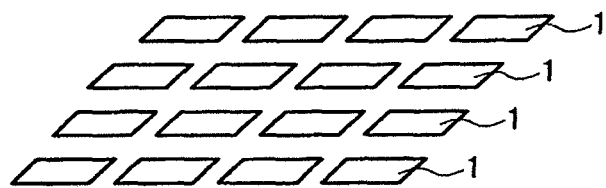
Figure 6:
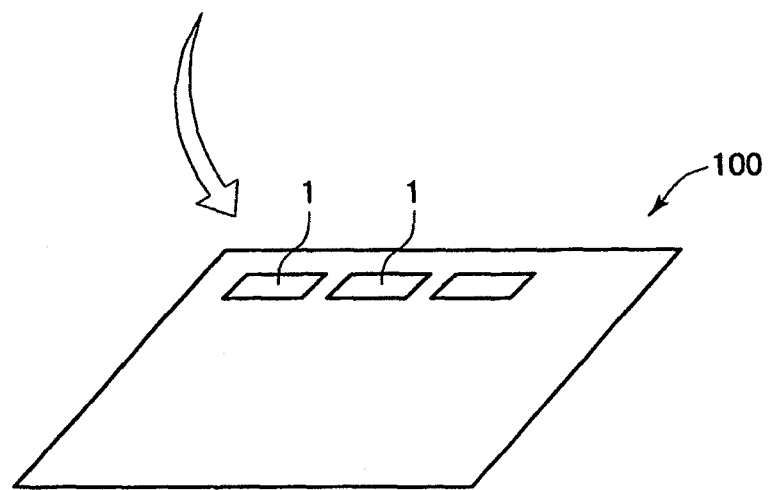
Figure 7:
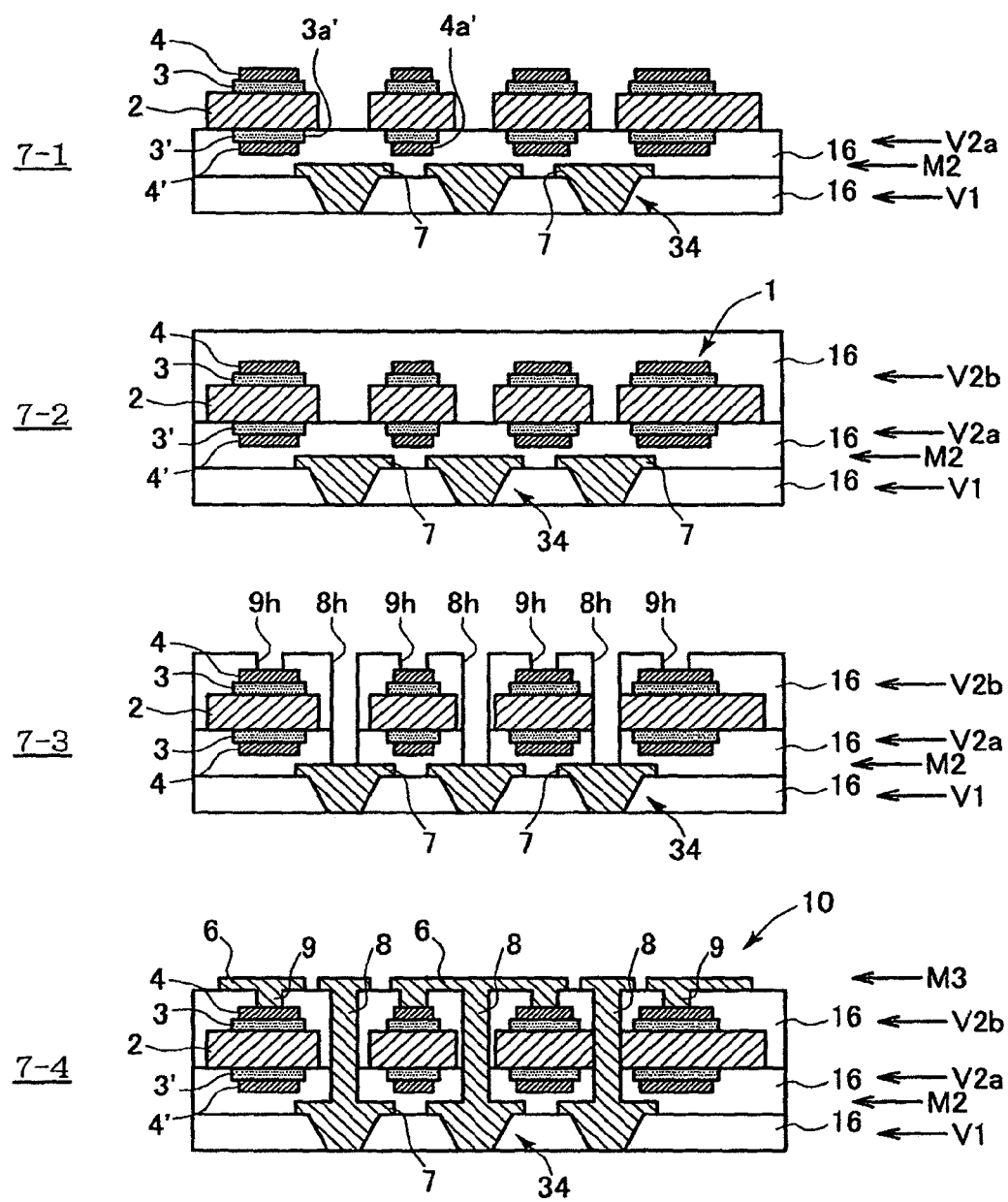
FIG. 7 is explanatory diagrams showing manufacturing steps of the capacitor following the steps of FIG. 6.

FIGS. 5-7 are explanatory diagrams showing a manufacturing process of the dielectric lamination structure 1 and the capacitor 10. First, as shown in FIG. 5 (5-1), a metal foil of nickel or the like which, for example, measures 150 mm×150 mm and is 10 to 40 μm in thickness is prepared and plural through-holes 2a are formed in a prescribed pattern so as to be separated from each other by etching such as wet etching. The through-holes 2a may be formed by laser light instead of etching. The through-holes 2a are formed so that the minimum one of their via pitches P falls within a range of 100 to 350 μm and that they correspond to vias 3a and 3a' which will be formed in first and second dielectric layers 3 and 3' at different diameters which fall within a range of 100 to 300 μm (described later).

Then, pre-firing barium titanate green sheets, which measure 150 mm×150 mm and are 0.3 to 5 μm in thickness and which will become first and second dielectric layers 3 and 3' after firing, are laid on both of the front and back surfaces of the metal foil 2 having the through-holes 2a, and are pressure-bonded to the metal foil 2 under prescribed conditions. The barium titanate green sheets are obtained by forming thin-films of barium titanate slurry on carrier sheets 3s and 3s' of polyester or the like by a known doctor blade method and drying the thin films. The barium titanate green sheets are laid on both of the front and back surfaces of the metal foil 2 and pressure-bonded to the metal foil 2 under prescribed conditions, and then the carrier sheets 3s and 3s' are peeled off.

Then, as shown in FIG. 5 (5-2), pre-firing nickel green sheets, which measure 150 mm×150 mm and are 0.3 to 10 μm in thickness and which will become first and second conductor layers 4 and 4' after firing, are laid on the first and second dielectric layers 3 and 3', respectively. The nickel green sheets are obtained by forming thin-films of nickel slurry on carrier sheets 4s and 4s' of polyester or the like by a known doctor blade method and drying the thin films. The nickel green sheets are laid on the surfaces of the barium titanate green sheets and pressure-bonded to them under prescribed conditions, and then the carrier sheets 4s and 4s' are peeled off (see FIG. 5 (5-3)). A ceramic powder of, for example, barium titanate, which is contained in the first and second dielectric layers 3 and 3', may be mixed into the slurry for forming the nickel green sheets at 50 vol % or less. Mixing the same component as the first and second dielectric layers 3 and 3' are made of into the first and second conductor layers 4 and 4' can further increase the adhesion when the first and second dielectric layers 3 and 3' and the first and second conductor layers 4 and 4' are fired at the same time. If the ceramic powder were mixed at more than 50 vol %, reduction in conductivity (i.e., increase in resistivity), reduction in flexibility, or a like phenomenon may occur after the firing. The first and second dielectric layers 3 and 3' and the first and second conductor layers 4 and 4' may be laminated on the metal foil 2 by pressure-bonding the former to the latter after laying the former on the latter.

Then, as shown in FIG. 5 (5-4), vias 3a and 3a' and vias 4a and 4a' are formed through the first and second dielectric layers 3 and 3' and the first and second conductor layers 4 and 4' in the thickness direction from both sides by, for example, a method using laser light at the positions corresponding to the through-holes 2a of the metal foil 2. Where each set of vias 3a, 3a', 4a, and 4a' is formed through the first and second dielectric layers 3 and 3' and the first and second conductor layers 4 and 4' simultaneously by laser light, the portions concerned of the first and second conductor layers 4 and 4' are melted earlier than the portions concerned of the first and second dielectric layers 3 and 3' because the melting point of the former is lower than that of the latter, whereby the via diameter $D_2$ of the first and second conductor layers 4 and 4' becomes larger than the via diameter $D_1$ of the first and second dielectric layers 3 and 3'.

It is preferable that the diameter $D_1$ of each pair of vias 3a and 3a' be larger than the diameter $D_0$ of the corresponding through-hole 2a and fall within a range of 100 to 300 μm. It is preferable that the diameter $D_2$ of the corresponding pair of vias 4a and 4a' be larger than the diameter $D_1$ of the pair of vias 3a and 3a' by 5 to 50 μm ($D_1+5$ μm≤$D_2$≤$D_1+50$ μm). Making each pair of vias 4a and 4a' of the first and second conductor layers 4 and 4' wider than the corresponding pair of vias 3a and 3a' of the first and second dielectric layers 3 and 3' makes it possible to electrically insulate the metal foil 2 from the first and second conductor layers 4 and 4' in a reliable manner.

It is preferable that the diameter $D_1$ of each pair of vias 3a and 3a' be larger than the via diameter $D_0$ of the corresponding through-hole 2a by 10 to 40 μm ($D_1+10$ μm≤$D_2$≤$D_1+40$ μm), for the following reasons. If the diameter difference were smaller than 10 μm, laser light would also shine on the first and second dielectric layers 3 and 3' when via through-holes 8h to be used for forming via conductors 8 (described later) are formed, as a result of which cracks or the like might develop in the first and second dielectric layers 3 and 3'. If the diameter difference were larger than 40 µm, the area of the first and second conductor layers 4 and 4' would be come smaller than a desired value, as a result of which the capacitance might become smaller than a desired value.

Then, as shown in FIG. 6 (6-1 and 6-2), the thus-obtained structure is cut into, for example, 15-mm-square sections by a cutting machine (not shown) and those sections are subjected to degreasing and firing under prescribed conditions, whereby dielectric lamination structures 1 having communication holes 5 which are formed in a prescribed pattern are produced.

Then, as shown in FIG. 6 (6-3), each of the thus-obtained dielectric lamination structures 1 is mounted at a prescribed position in the first wiring lamination portion L1 of a wiring board 100 which was formed by a known build-up method, for example.

More specifically, as shown in FIG. 7 (7-1), in an in-process wiring board 100, an insulating resin layer 16 (V1), via conductors 34, and a conductor layer M2 are formed by a known build-up method. At this time, the conductor layer M2 is formed in a prescribed pattern so that it will become a second outer electrode layer 7 of a capacitor 10 when the dielectric lamination structure 1 is mounted. Then, an insulating resin layer 16 (V2a) made of a thermosetting resin composition or the like is formed on the insulating resin layer 16 (V1) and the conductor layer M2. Then, the dielectric lamination structure 1 is mounted on the insulating resin layer 16 (V2a) by a mounter (not shown). At this time, since the dielectric lamination structure 1 is mounted in a state that the insulating resin layer 16 (V2a) has not been set at all or has been set halfway, the dielectric lamination structure 1 can be mounted by pressure-bonding it to the insulating resin layer 16 (V2a) as formed which is flat. Portions of the insulating resin layer 16 (V2a) rise (flow up) relatively into the communication holes 5, and are thereby go into and attached to the lower portions of the communication holes 5 (i.e., the vias 3a' of the second dielectric layer 3' and the vias 4a' of the second conductor layer 4'). An alternative method is such that the insulating resin layer 16 (V2a) is set, a separate adhesive or the like is applied to it, and then the dielectric lamination structure 1 is put thereon. On the other hand, the dielectric lamination structure 1 is mounted on the insulating resin layer 16 (V2a) while being pressed against the insulating resin layer 16 (V2a). However, since the dielectric lamination structure 1 is provided with the metal foil 2 which is high in rigidity, no warp, cracks, or the like occur in the dielectric lamination structure 1. Furthermore, since the dielectric lamination structure 1 is provided with the plural communication holes 5 which extend in the thickness direction, air etc. existing between the dielectric lamination structure 1 and the insulating resin layer 16 (V2a) are guided to above the dielectric lamination structure 1 via the communication holes 5, whereby entrance of air bubbles is prevented and the dielectric lamination structure 1 can be mounted easily. Still further, the communication holes 5 increase the area of contact between the dielectric lamination structure 1 and the insulating resin layer 16 (V2a), as a result of which the adhesion between them is increased and such trouble as peeling can be avoided.

Then, as shown in FIG. 7 (7-2), an insulating resin layer 16 (V2b) made of a thermosetting resin composition or the like is formed so as to cover the dielectric lamination structure 1.

Then, as shown in FIG. 7 (7-3), via holes 8h and 9h are formed through the insulating resin layers 16 (V2a) and 16 (V2b) at prescribed positions by laser light.

Subsequently, as shown in FIG. 7 (7-4), via conductors 8 and 9 are formed by filling the thus-formed via holes 8h and 9h by Cu plating or the like and a conductor layer M3, which will become a first outer electrode layer 6, is formed in a prescribed pattern. More specifically, the insides of the via holes 8h and 9h and the surface of the insulating resin layer 16 (V2b) are subjected first to Cu electroless plating and then to Cu electroplating. Then, via conductors 8 and 9 and a conductor layer M3 including a first outer electrode layer 6 are formed by forming an etching resist layer having a prescribed pattern on the Cu plating layer and etching away those portions of the Cu plating layer which are exposed from the etching resist layer. As a result of the execution of this step, the first and second outer electrode layers 6 and 7, the metal foil 2, and the first and second conductor layers 4 and 4' are electrically connected to each other and a capacitor 10 is thereby completed. Alternatively, the conductor layer M3, which will become a first outer electrode layer 6 on the insulating resin layer 16 (V2b), may be formed by a semi-additive method in which Cu electroless plating is performed first, a plating resist layer is formed in a prescribed pattern, Cu electroplating is then performed, portions of the plating resist layer are peeled off, and finally the plating-resist-layer-peeled portions of the Cu electroless plating layer are etched away.

The remaining part of a first wiring lamination portion L1 consisting of an insulating resin layer 16 (V3) and a conductor layer M4, a solder resist layer 18, etc. are laid one on another by a known build-up method, whereby a wiring board 100 is completed (see FIG. 4).

For example, the capacitor 10 can be mounted inside the first wiring lamination portion L1 according to the following procedure. First, the dielectric lamination structure 1 is, put on an insulating resin layer 16 (V2a) formed on a board core 12. Then, an insulating resin layer 16 (V2b) is laid on the dielectric lamination structure 1 and pressure is exerted on them while they are heated. As a result, portions of the insulating resin films 16 (V2a and V2b) flow laterally to the dielectric lamination structure 1, whereby the dielectric lamination structure 1 is placed within the thickness of the insulating resin layers 16. Then, via holes 8h and 9h are formed through the insulating resin layers 16 (V2a and V2b) right above a conductor layer M2. Via conductors 34 are formed so as to be connected to conductor layers in the via holes 8h and 9h, whereby a capacitor 10 is completed. The via conductors 34 can be formed by using a via paste which will become via conductors 34 after thermal setting or by plating. Subsequently, an insulating resin layer 16 (V3) is formed on the capacitor 10.

Next, another embodiment of the invention will be described with reference to the accompanying drawings. In the following configuration, members having the same functions as corresponding members of the above embodiment will be given the same symbols as the latter and will not be described in detail.

Figure 8:
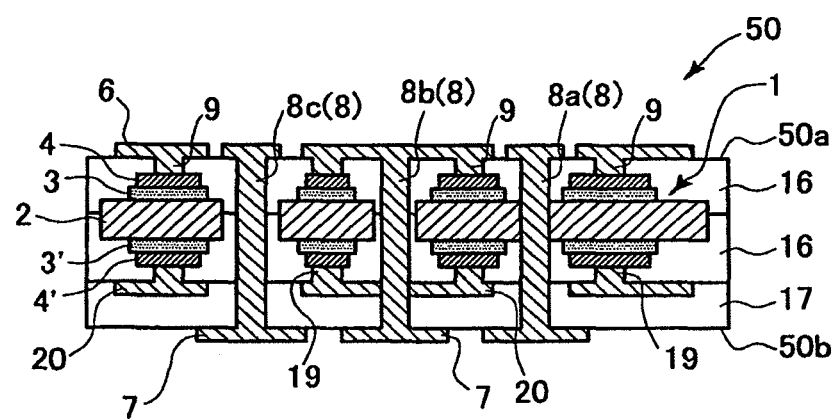
FIG. 8 is a sectional view of a capacitor according to another (second) embodiment of the invention.

FIG. 8 is a schematic diagram of a capacitor 50 according to another (second) embodiment of the invention. As shown in FIG. 8, the capacitor 50 is provided with a dielectric lamination structure 1 (core member), insulating resin layers 16 and 17 which cover the dielectric lamination structure 1, a first outer electrode layer 6 formed on a first major surface 50a of the capacitor 50, a second outer electrode layer 7 formed on a second major surface 50b of the capacitor 50, via conductors 8a, 8b, and 8c which penetrate through the capacitor 50 in the thickness direction and electrically connect the first and second outer electrode layers 6 and 7, via conductors 9 which penetrate through the insulating resin layer 16 from the first major surface 50a to the first conductor layer 4 and electrically connect the first outer electrode layer 6 and the first conductor layer 4, a lower electrode layer 20 formed between the lower insulating resin layers 16 and 17 which are disposed under the dielectric lamination structure 1, and via conductors 19 which electrically connect the lower electrode layer 20 and the second conductor layer 4'. The second conductor layer 4' is electrically connected to the via conductor(s) 8b via the lower electrode layer 20 and the via conductors 19.

The capacitor 50 can provide a sufficient capacitance because it is composed of the metal foil 2, the first and second dielectric layers 3 and 3' which are formed on both of the front and back surfaces of the metal foil 2, and the first and second conductor layers 4 and 4'. The plural via conductors 19 are provided for the second conductor layer 4' in array form. Like the above-described capacitor 10, the capacitor 50 can be incorporated in the first wiring lamination portion L1 of the wiring board 100. A manufacturing process of the capacitor 50 will be described below.

Figure 9:
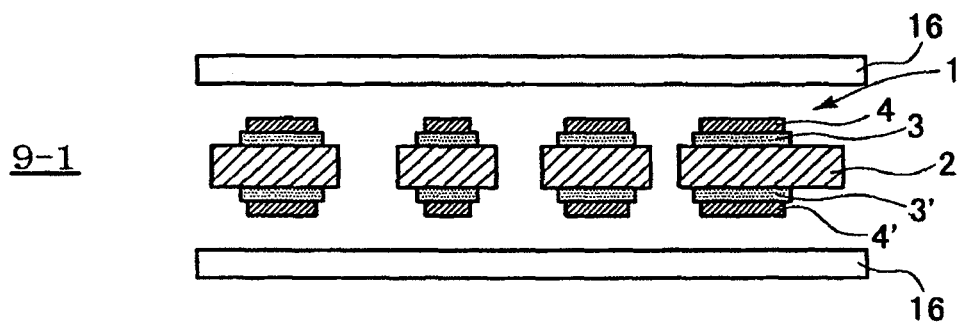
FIG. 9 is explanatory diagrams showing manufacturing steps of the capacitor according to the second embodiment.
Figure 9:
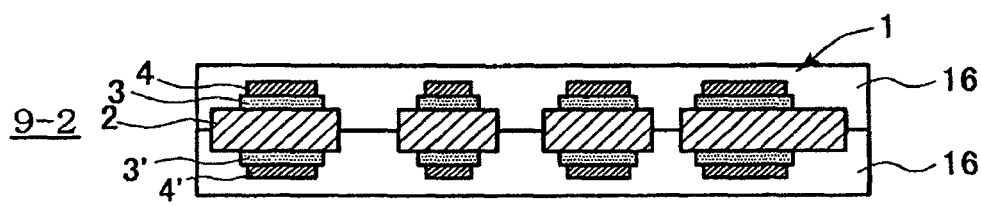
Figure 9:
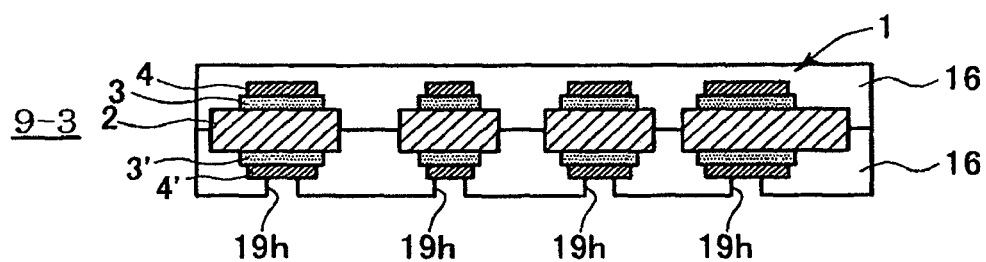
Figure 9:
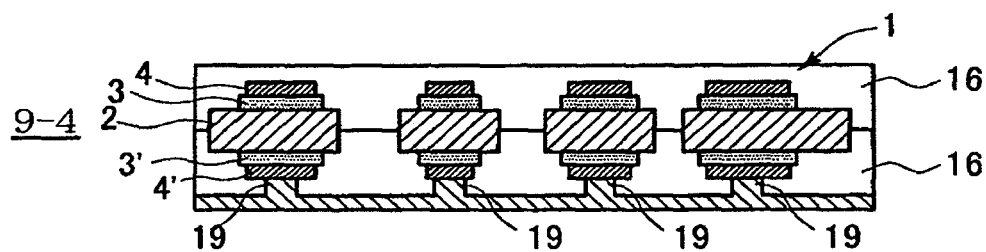
Figure 10:
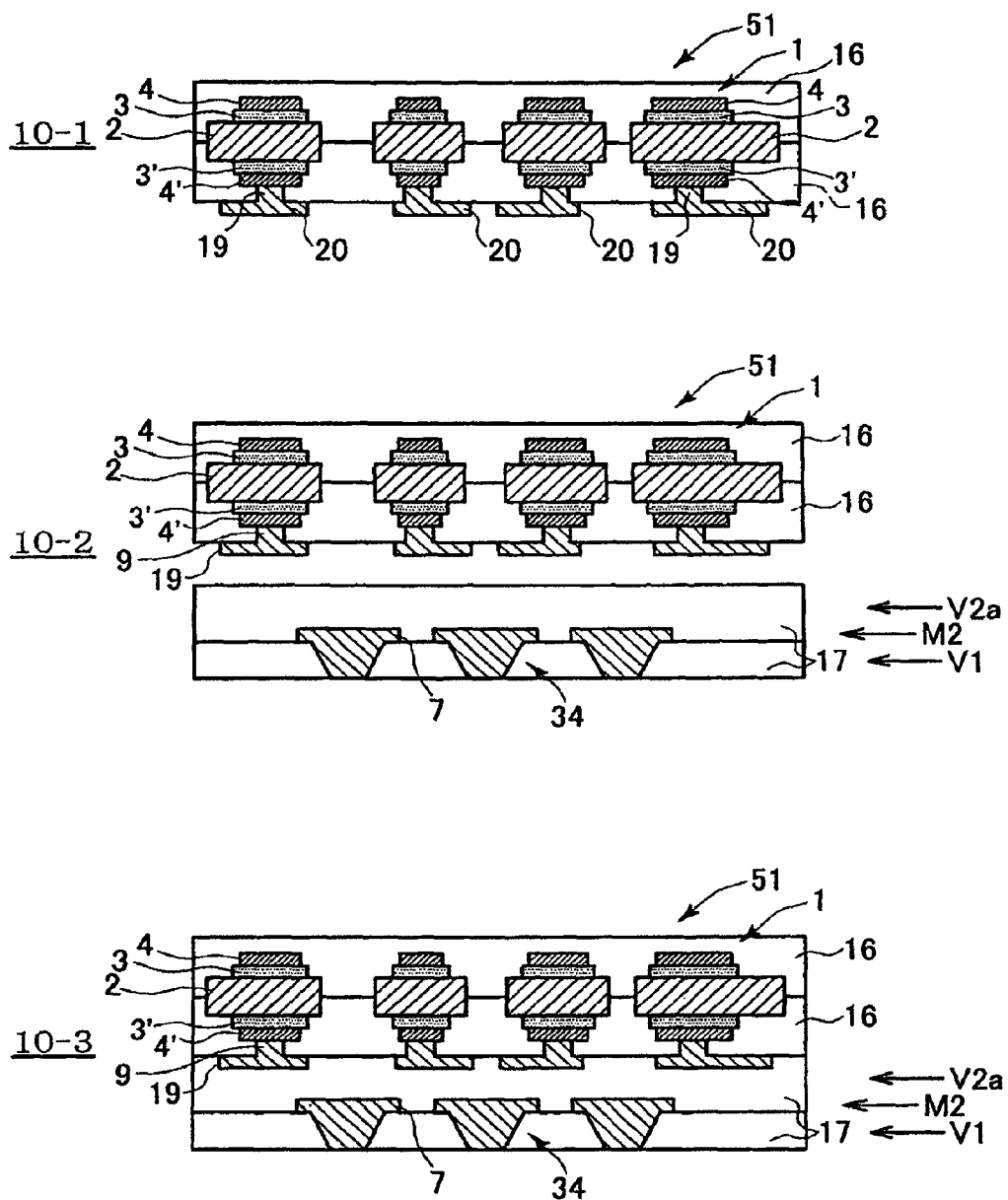
FIG. 10 is explanatory diagrams showing manufacturing steps of the capacitor following the steps of FIG. 9.
Figure 11:
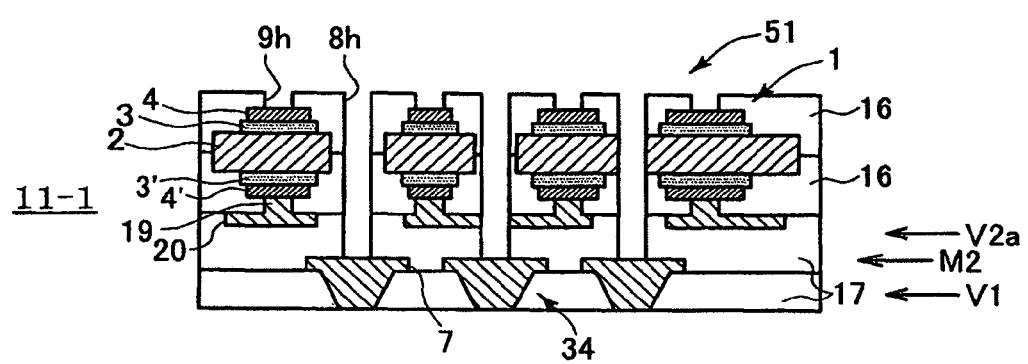
FIG. 11 is explanatory diagrams showing manufacturing steps of the capacitor following the steps of FIG. 10.
Figure 11:
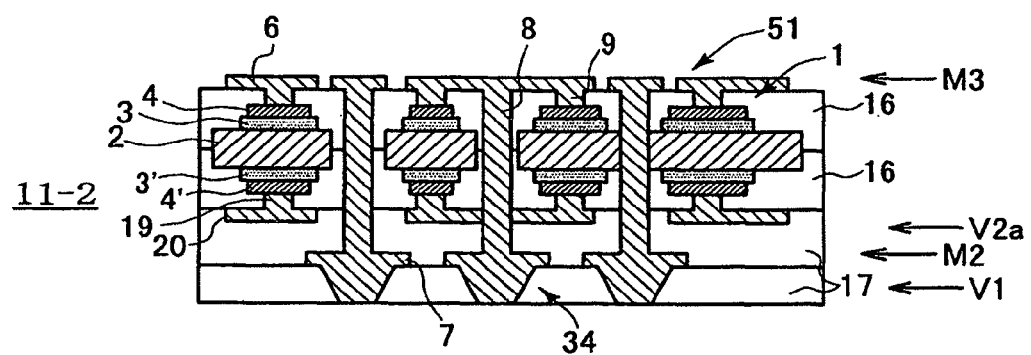

FIGS. 9-11 are explanatory diagrams showing a manufacturing process of the capacitor 50 according to the second embodiment of the invention. First, as shown in FIG. 9 (9-1), a dielectric lamination structures 1 is manufactured and insulating resin layers 16 are formed by laminating sheets made of a thermosetting resin composition, for example, on the dielectric lamination structures 1 (see FIG. 9 (9-2)). Then, after the insulating resin layers 16 are half set, as shown in FIG. 9 (9-3) via holes 19h are formed through the lower insulating resin layer 16 by laser light at prescribed positions (i.e., in array form for the second conductor layer 4').

Then, via conductors 19 are formed by filling the insides of the thus-formed via holes 19h by Cu plating or the like as shown in FIG. 9 (9-4), and a lower electrode layer 20 is formed in a prescribed pattern (see FIG. 10 (10-1)). More specifically, the insides of the via holes 19h and the surface of the insulating resin layer 16 are subjected first to Cu electroless plating and then to Cu electroplating. Then, via conductors 19 and a lower conductor layer 20 are formed by forming an etching resist layer having a prescribed pattern on the Cu plating layer and etching away those portions of the Cu plating layer which are exposed from the etching resist layer. As a result of the execution of this step, the second conductor layer 4' and the lower electrode layer 20 are electrically connected to each other by the via conductors 19.

Then, as shown in FIG. 10 (10-2), a lamination body 51 having the thus-formed lower electrode layer 20 is mounted at a prescribed position in the first wiring lamination portion L1 of a wiring board 100 which was formed by a known build-up method, for example. More specifically, in an in-process wiring board 100, an insulating resin layer 16 (V1), via conductors 34, and a conductor layer M2 are formed by a known build-up method. At this time, the conductor layer M2 is formed in a prescribed pattern so that it will become a second outer electrode layer 7 of a capacitor 50 when the dielectric lamination structure 1 is mounted. Then, an insulating resin layer 16 (V2a) made of a thermosetting resin composition or the like is formed on the insulating resin layer 16 (V1) and the conductor layer M2. Then, as shown in FIG. 10 (10-3), the lamination body 51 is mounted on the insulating resin layer 16 (V2a) by a mounter (not shown). If necessary, a height adjustment is made as appropriate by forming an insulating resin layer 16 or the like on or around the lamination body 51.

Then, as shown in FIG. 11 (11-1), via through-holes 8h and 9h extending in the thickness direction are formed through the insulating resin layers 16 and 17 at prescribed positions by laser light.

Subsequently, as shown in FIG. 11 (11-2), via conductors 8 and 9 are formed by filling the insides of the thus-formed via holes 8h and 9h by Cu plating or the like and a conductor layer M3, which will become a first outer electrode layer 6, is formed in a prescribed pattern. More specifically, the insides of the via holes 8h and 9h and the surface of the insulating resin layer 16 (V2b) are subjected first to Cu electroless plating and then to Cu electroplating. Then, via conductors 8 and 9 and a conductor layer M3 including a first outer electrode layer 6 are formed by forming an etching resist layer having a prescribed pattern on the Cu plating layer and etching away those portions of the Cu plating layer which are exposed from the etching resist layer. As a result of the execution of this step, the first and second outer electrode layers 6 and 7, the metal foil 2, and the first and second conductor layers 4 and 4' are electrically connected to each other and a capacitor 50 is thereby completed.

The remaining part of a first wiring lamination portion L1 consisting of an insulating resin layer 16 and a conductor layer M4, a solder resist layer 18, etc. are laid one on another by a known build-up method, whereby a wiring board 100' is completed (see FIG. 4). The capacitor 50 is somewhat different in structure from the capacitor 10 which is incorporated in the wiring board 100 of FIG. 4 and which includes the dielectric lamination structure 1 of the above-described embodiment the only one side portion of which is used to form the capacitor 10. However, the capacitor 50 can be incorporated in the wiring board 100' according to the same procedure as the capacitor 10 is incorporated in the wiring board 100.

Figure 14A:
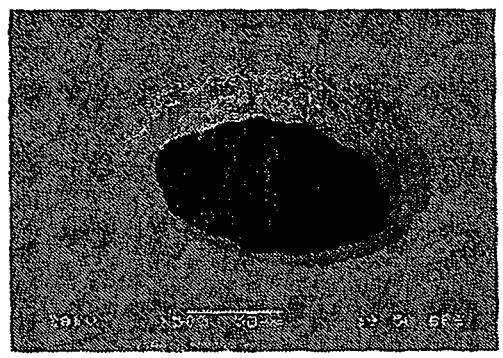
FIG. 14A is a photograph showing the state of the side surface of a through-hole of a pre-firing petal foil used in the dielectric lamination structure according to the invention.
Figure 14B:
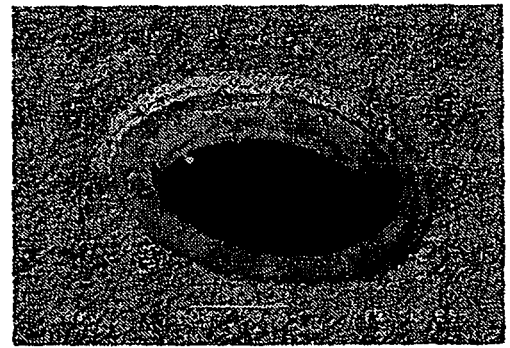
FIG. 14B is a photograph showing the state of the side surface of a through-hole of a post-firing metal foil used in the dielectric lamination structure according to the invention.

In the embodiments, the manufacturing method of the dielectric lamination structure 1 is such that the through-holes 2a are formed before the first and second dielectric layers 3 and 3' are formed on the major surfaces of the metal foil 2. Therefore, the first and second dielectric layers 3 and 3' are not exposed to an etching liquid. This can reduce the degree of damage of the first and second dielectric layers 3 and 3', and hence can suppress reduction in the insulation resistance of the first and second dielectric layers 3 and 3', peeling or the like of the first and second dielectric layers 3 and 3' off the metal foil 2, and other undesired phenomena. FIG. 14A is a photograph showing the state of the side surface of a through-hole of a pre-firing metal foil used in the embodiment, and FIG. 14B is a photograph showing the state of the side surface of a through-hole of a post-firing metal foil used in the embodiment. Where the through-holes 2a are formed before the first and second dielectric layers 3 and 3' are formed on the major surfaces of the metal foil 2, since firing is performed in a state that the through-holes 2a are formed in the metal foil 2, the side surfaces $2a_1$ of the through-holes 2a are roughened by the etching (see FIG. 14A) but are then flattened by the firing (see FIG. 14B) because metal particles of the metal foil 2 grow (combined with each other) during the firing. The side surfaces $2a_1$ of the through-holes 2a are also flattened in the above-described manner even in the case where the through-holes 2a are formed by etching in a state that the first and second dielectric layers 3 and 3' are formed on the major surfaces of the metal foil 2 and firing is performed thereafter. However, in this case, the first and second dielectric layers 3 and 3' are corroded by an etching liquid and thereby damaged. Therefore, if the side surfaces $2a_1$ of the through-holes 2a are flattened and the first and second dielectric layers 3 and 3' are not damaged much, it can be judged that the through-holes 2a were formed before the first and second dielectric layers 3 and 3' were formed on the major surfaces of the metal foil 2.

Where the through-holes 2a are formed through the metal foil 2 in a state that at least one of the metal foil 2, the first and second dielectric layers 3 and 3', and the first and second conductor layers 4 and 4' is buried in a wiring board, firing should be performed in a state that it is buried in the wiring board. However, it is difficult to heat the wiring board to a firing temperature. In contrast, in the embodiments, since the through-holes 2a are formed through the metal foil 2 in a state that none of the metal foil 2, the first and second dielectric layers 3 and 3', and the first and second conductor layers 4 and 4' are buried in the wiring board 100 or 100', firing can be performed in a state that the dielectric lamination structure 1 is not buried in the wiring board 100 or 100'. The wiring boards 100 and 100' incorporating the respective capacitors 10 and 50 can thus be manufactured.

If firing is performed in a state that the first dielectric layer 3 and the first conductor layer 4 are formed on only one major surface of the metal foil 2, deformation such as a warp or an undulation may occur in the dielectric lamination structure 1 at the time of sintering because almost no contraction occurs in the metal foil 2 at the time of sintering whereas the first dielectric layer 3 is sintering-contracted. Where the first dielectric layer 3 and the metal foil 2 are different from each other in thermal expansion coefficient, deformation such as a warp or an undulation may occur in the dielectric lamination structure 1 due to the difference in thermal expansion coefficient particularly when the temperature of the first dielectric layer 3 decreases after the sintering. This makes it difficult to incorporate the dielectric lamination structure 1 into a wiring board. If it is attempted to forcibly incorporate the dielectric lamination structure 1 into a wiring board, cracks may develop in the first dielectric layer 3. In contrast, in the embodiments, since the first and second dielectric layers 3 and 3' and the first and second conductor layers 4 and 4' are formed on both major surfaces of the metal foil 2, deformation such as a warp or an undulation is not prone to occur in the dielectric lamination structure 1 at the time of sintering. This allows the dielectric lamination structure 1 to be incorporated into the wiring board 100 or 100' easily. Furthermore, since the first and second dielectric layers 3 and 3' and the first and second conductor layers 4 and 4' are formed on both major surfaces of the metal foil 2, an about two times larger capacitance can be obtained than in the case where the first dielectric layer 3 and the first conductor layer 4 are formed on only one major surface of the metal foil 2.

Figure 15A:
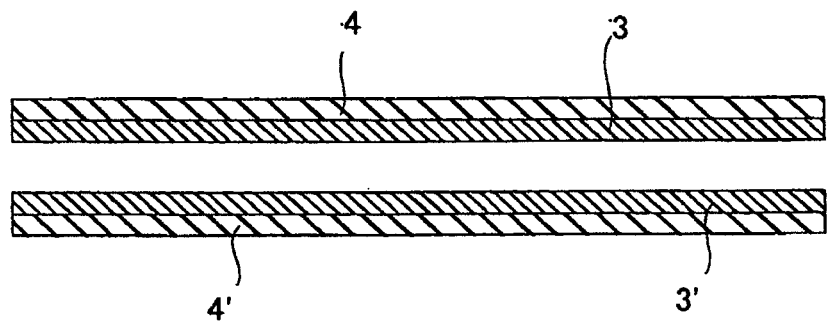
FIGS. 15A, 15B and 15C show another manufacturing process of a dielectric lamination structure.

A manufacturing process of the dielectric lamination structure 1 which is different from the manufacturing process described above with reference to FIG. 5 will be described below with reference to FIGS. 15A, 15B and 15C.

First, through-holes 2a are formed through a metal foil 2. On the other hand, conductor layers 4 and 4' are pressure-bonded to respective dielectric layers 3 and 3'. As a result, as shown in FIG. 15A, the conductor layers 4 and 4' are formed on the respective dielectric layers 3 and 3'.

Figure 15B:
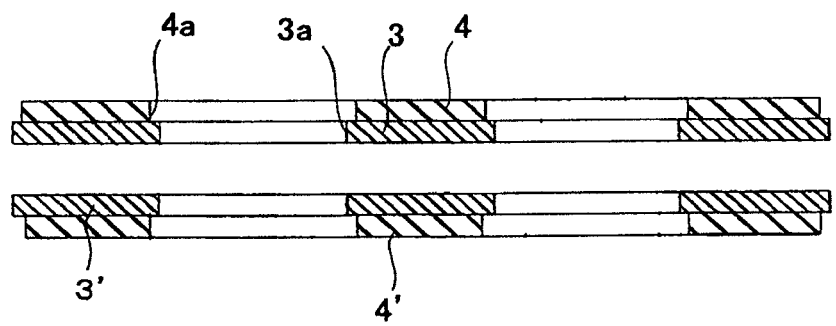
Figure 15C:
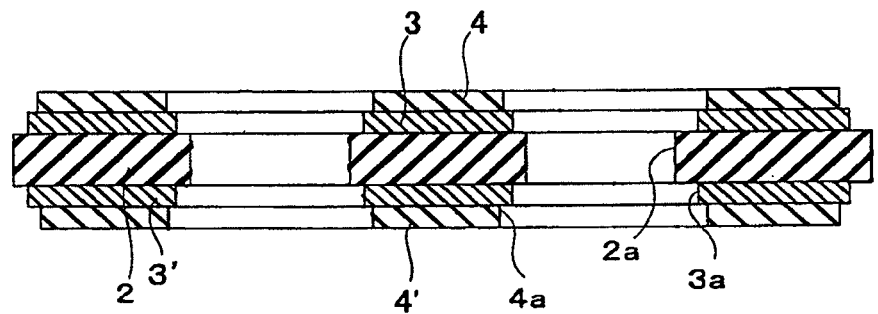

Then, as shown in FIG. 15B, each set of vias 3a and 4a is formed simultaneously through the dielectric layer 3 or 3' and the conductor layer 4 or 4' by laser light. The side surface of each via 4a is retreated from the corresponding via 3a.

After the vias 3a and 4a have been formed through the dielectric layers 3 and 3' and the conductor layers 4 and 4', the dielectric layers 3 and 3' and the conductor layers 4 and 4' are positioned with respect to the metal foil 2 so that the vias 3a and 4a communicate with the respective through-holes 2a. And the dielectric layers 3 and 3' and the conductor layers 4 and 4' are pressure-bonded to the major surfaces of the metal foil 2 through which the through-holes 2a are formed. As a result, as shown in FIG. 15C, the dielectric layers 3 'and 3' and the conductor layers 4 and 4' are formed on the major surfaces of the metal foil 2. Then, the same steps including firing as described above are executed, whereby a dielectric lamination structure is obtained which is the same as the dielectric lamination structure 1 shown in FIG. 1.

EXAMPLES

The following experiment was carried out to confirm the advantages of the invention.

(1) Formation of Barium Titanate (BT) Green Sheet

First, a prescribed dispersant and plasticizer were added to a BT powder of 0.7 µm in average particle diameter and they were subjected to wet mixing in a mixed solvent of ethanol and toluene. After sufficient mixing, a binder was added and mixing was performed further. Then, a 7-µm thick BT green sheet was formed by a general-purpose method such as a doctor blade method by using resulting slurry.

(2) Formation of Nickel Green Sheet

A 7-µm thick nickel green sheet was formed by mixing a nickel powder of 0.4 µm in average particle diameter with a barium titanate powder at a volume ratio of 7:3 by a method similar to the method of item (1).

(3) Manufacture of Dielectric Lamination Structure

A 30-µm thick nickel foil was cut into 150-mm-square sections by etching, and through-holes were formed through them. Each of the BT green sheet and the nickel green sheet was also cut into 160-mm-square sections. Then, after BT green sheets were laid on both surfaces of a nickel foil, the former were pressure-bonded to the latter under the conditions of 80° C. and 500 kgf/cm$^2$. After PET (polyethylene terephthalate) carrier sheets were peeled off the respective BT green sheets, nickel green sheets were laid on the surfaces of the respective BT green sheets and the former were pressure-bonded to the latter under the conditions of 80° C. and 750 kgf/cm$^2$ (main pressure bonding). With PET carrier sheets kept stuck to the respective nickel green sheets, through-holes were formed through both BT green sheets and both nickel green sheets by laser light at the same positions as the through-holes of the nickel foil in such a manner that the diameters of each set of through-holes became larger than the diameter of the corresponding through-hole of the nickel foil. Then, a resulting structure was cut into 25-mm-square sections by a general-purpose cutting machine and the carrier sheets were peeled off, whereby unfired dielectric lamination structures were produced. Alternatively, pressure bonding may be performed under the conditions of 80° C. and 500 kgf/cm$^2$ after BT green sheets and nickel green sheets are laid on a nickel foil.

(4) Degreasing and Firing

An unfired dielectric lamination structure produced by the preceding step was degreased in the air at 250° C. for 10 hours and fired in a reducing atmosphere at 1,300° C. After the firing, each BT dielectric layer and each nickel conductor layer were 4 µm in thickness.

(5) Bending Test

Figure 12:
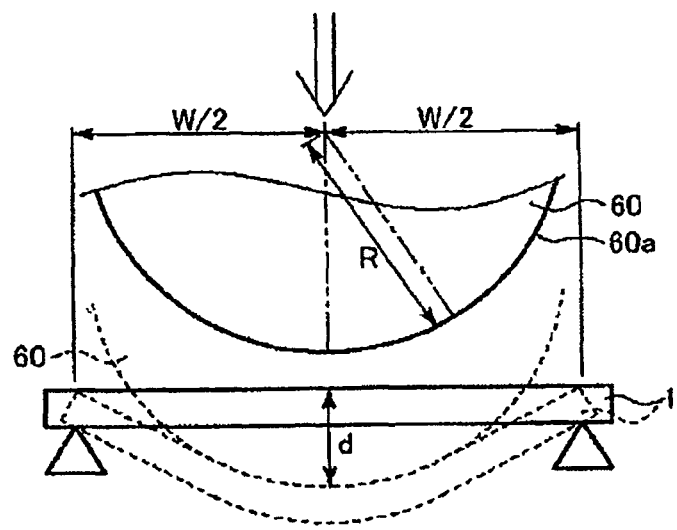
FIG. 12 is a conceptual diagram showing a measuring method.
Figure 13:
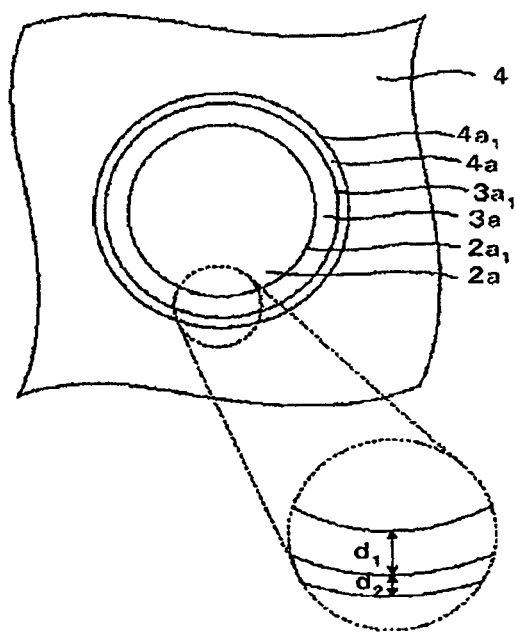
FIG. 13 is a plan view of the exemplary dielectric lamination structure according to the invention.

FIG. 12 is a schematic diagram showing a measuring method for measuring a bendable radius of curvature of the thus-produced dielectric lamination structure. Several kinds of jigs 60 whose pressing surfaces 60a have various radii R of curvature were produced. Each jig 60 was pressed against the dielectric lamination structure until the surface of the dielectric lamination structure conformed to the pressing surface 60a, and the radius R of curvature of the jig 60 used was measured. A bendable radius R of curvature was determined afterwards on the basis of whether or not the dielectric lamination structure was broken.

In Example, the test result was such that the jigs 60 whose pressing surfaces 60a had radii R of curvature of 5 mm or more were able to bend the dielectric lamination structure. It is known that not a low degree of bend (radius of curvature: about 500 mm) occurs in a capacitor during a manufacturing process. Therefore, it can be said that a capacitor that can be deformed in a radius-of-curvature range of 5 to 500 mm was obtained. That is, a capacitor which is rigid enough to endure a warp in the above range was obtained. No reduction in capacitance was found in a thermal shock test.

(6) Mounting on Wiring Board

An insulating resin film was laminated on a wiring board that was manufactured by a known process. The dielectric lamination structure was mounted on the insulating resin film at a prescribed position with a mounter and the insulating resin film was set tentatively (roughened).

(7) Manufacture of Capacitor-Incorporated Board

An insulating resin film was laminated on the dielectric lamination structure, vias were formed at prescribed positions by laser light, and Cu plating was performed, whereby a capacitor having an array structure was formed. Then, a capacitor-incorporated board was completed by a known build-up process.

(8) Reliability Evaluation (Thermal Shock JESD 22-A106B (JEDEC Standard))

The thus-manufactured capacitor-incorporated board was subjected to a thermal shock test in which it was immersed alternately in a liquid tank of −50° C. and a liquid tank of +50° C. (1,000 cycles). Capacitance values before and after the test were measured. No change was found between the capacitance values measured before and after the test.

(9) Peeling Test

After an insulating resin film was laminated on a wiring board, the dielectric lamination structure was mounted on the insulating resin film at a prescribed position with a mounter. Then, the resin was set by heating. Then, the dielectric lamination structure was subjected to a peeling test. It was found that strong force was necessary to peel off the dielectric lamination structure and hence the dielectric lamination structure could not be peeled off easily. An observation of the place, from which the dielectric lamination structure was peeled off, found no air bubble marks.

A dielectric lamination structure of Comparative Example 1 was manufactured in the same manner as described above by using a 100-μm thick nickel foil and a 30-μm thick BT green sheet. Being thick, the dielectric lamination structure of Comparative Example 1 was broken (e.g., cracks developed) when the jigs were pressed against it. Furthermore, reduction in capacitance occurred in a thermal shock test.

Dielectric lamination structures and wiring boards of Comparative Examples 2 and 3 were manufactured by manufacturing methods that were different from the manufacturing method of Example.

In Comparative Example 2, an Ni foil (metal foil), barium titanate green sheets (dielectric layers), Ni paste layers (conductor layers) were used and a dielectric lamination structure was manufactured in which barium titanate layers and Ni layers were formed on an Ni film. And a wiring board incorporating a dielectric lamination structure was manufactured by using the thus-manufactured dielectric lamination structure.

More specifically, vias were formed in barium titanate green sheets by laser light in advance at positions corresponding to through-holes of the Ni foil. The barium titanate green sheets were positioned with respect to the Ni foil and pressure-bonded to the latter. Then, Ni paste layers were formed on the barium titanate green sheets by screen printing. The other conditions were the same as in Example.

In Comparative Example 3, an Ni foil (metal foil), barium titanate green sheets (dielectric layers), Ni paste layers (conductor layers) were used and a dielectric lamination structure in which barium titanate layers and Ni layers were formed on an Ni film was manufactured. And a wiring board incorporating a dielectric lamination structure was manufactured by using the thus-manufactured dielectric lamination structure.

More specifically, vias were formed in barium titanate green sheets by laser light in advance at positions corresponding to through-holes of the Ni foil. The barium titanate green sheets were positioned with respect to the Ni foil and pressure-bonded to the latter. Then, Ni paste layers were formed on the barium titanate green sheets by screen printing. However, in Comparative Example 3, to prevent the Ni paste layers from going into the vias of the barium titanate green sheets, a printing mask was used which makes the length of retreat of the side surfaces of the vias of the Ni paste layers from those of the vias of the barium titanate green sheets greater than in Comparative Example 2.

The portions of the Ni layers in the vicinities of the vias of the barium titanate layers of the above-described dielectric lamination structure of each of Comparative Examples 2 and 3 were observed and lengths of retreat of the side surfaces of the vias of the Ni paste layers from those of the vias of the barium titanate layers were measured.

In Comparative Example 2, portions of the Ni layers went into the vias of the barium titanate layers, whereby the Ni foil and the Ni layers were short-circuited with each other. On the other hand, in Comparative Example 3, since the length of retreat was 60 μm which was too great, the capacitance of the capacitor was out of an allowable range. Also in Example, since the side surfaces of the vias of the Ni layers were retreated, the capacitance of the capacitor was reduced accordingly. However, since the length of retreat was as short as 12 μm, the capacitance of the capacitor was within the allowable range.

The above results show that, in Example, although vias were formed through the dielectric layers and the conductor layers simultaneously by laser light in a state that the dielectric layers and the conductor layers were formed on the metal foil, it was possible to prevent short-circuiting between the metal foil and the conductor layers and to suppress reduction in the capacitance of a capacitor.

The invention is not limited to the above-described embodiments and Example and various modifications to those can be made in accordance with the purpose or use without departing from the spirit and scope of the invention.

This application is based on Japanese Patent Application JP 2005-353791, filed Dec. 7, 2005, Japanese Patent Application JP 2006-14353, filed Jan. 23, 2006, and Japanese Patent Application JP 2006-283292, filed Oct. 18, 2006, the entire contents of which are hereby incorporated by reference, the same as if set forth at length.

What is claimed is:

1. A method for manufacturing a dielectric structure in which the dielectric structure includes a metal foil, a dielectric layer and a conductor layer provided in this order, vias which penetrate through both of the dielectric layer and the conductor layer, and through-holes which penetrate through the metal foil so as to communicate with the respective vias, the method comprising:
   forming the dielectric layer on the metal foil;
   forming the conductor layer on a side of the dielectric layer opposite the metal foil; and
   simultaneously forming the respective vias by laser light through both of the conductor layer and the dielectric layer after the conductor layer is formed on the dielectric layer, wherein the vias of the dielectric layer have different diameters which are in a range of from 100 to 300 μm, a diameter of the respective vias of the conductor layer is larger than a diameter of a corresponding via of the dielectric layer by 5 to 50 μm, and a minimum via pitch is from 100 to 350 μm.

2. The method according to claim 1, wherein the dielectric layer and the conductor layer are formed on both sides of the metal foil.

3. The method according to claim 2, wherein the through-holes which penetrate through the metal foil so as to communicate with the respective vias are formed before the dielectric layer and the conductor layer are formed on at least one side of the metal foil.

4. The method according to claim 1, wherein the diameter of the respective vias of the conductor layer is larger than a diameter of a corresponding via of the dielectric layer by 10 to 40 μm.

5. The method according to claim 1, wherein the metal foil has a thickness of from 10 to 40 μm.

6. The method according to claim 1, wherein the dielectric layer has a thickness of from 0.3 to 5 μm.

7. The method according to claim 1, wherein the conductor layer has a thickness of from 0.3 to 10 μm.

8. The method according to claim 1, wherein a diameter of the respective through-holes of the metal foil is smaller than a diameter of a corresponding via of the dielectric layer.

9. The method according to claim 1, wherein a positional deviation between a center of the respective vias of the dielectric layer and a center of a corresponding via of the conductor layer is 10 μm or less.

10. The method according to claim 1, wherein the metal foil is an Ni foil.

11. The method according to claim 1, wherein the conductor layer contains 50 vol % or less of ceramic powder.

12. The method according to claim 11, wherein the ceramic powder contained in the conductor layer has same composition as ceramics contained in the dielectric layer.

13. The method according to claim 11, wherein the ceramic powder contained in the conductor layer contains barium titanate.

14. The method according to claim 1, wherein the dielectric layer is pressure-bonded to the metal foil.

15. The method according to claim 1, wherein the conductor layer is pressure-bonded to the dielectric layer.

* * * * *